United States Patent
Wang et al.

(10) Patent No.: US 7,294,590 B2
(45) Date of Patent: Nov. 13, 2007

(54) SYSTEM AND METHOD FOR REMOVING CHARGES WITH ENHANCED EFFICIENCY

(75) Inventors: Yi Xiang Wang, Fremont, CA (US); Guofan Ye, South San Francisco, CA (US)

(73) Assignee: Hermes-Microvision, Inc., Hsinchu (TW)

( * ) Notice: Subject to any disclaimer, the term of this patent is extended or adjusted under 35 U.S.C. 154(b) by 302 days.

(21) Appl. No.: 11/035,048

(22) Filed: Jan. 12, 2005

(65) Prior Publication Data

US 2005/0201038 A1 Sep. 15, 2005

Related U.S. Application Data

(60) Provisional application No. 60/538,446, filed on Jan. 21, 2004.

(51) Int. Cl.
*H01L 21/00* (2006.01)

(52) U.S. Cl. .............. 438/795; 257/E21.328; 257/E21.529; 438/798

(58) Field of Classification Search ............. 438/795, 438/798, 16; 257/E21.328, E21.529
See application file for complete search history.

(56) References Cited

U.S. PATENT DOCUMENTS

| | | | | |
|---|---|---|---|---|
| 4,916,082 A * | 4/1990 | Lesk et al. | ........... | 438/516 |
| 6,232,134 B1 * | 5/2001 | Farber et al. | ........... | 438/9 |
| 6,309,972 B1 * | 10/2001 | Pio | ........... | 438/689 |
| 6,465,781 B1 | 10/2002 | Nishimura et al. | | |
| 6,507,474 B1 | 1/2003 | Singh et al. | | |
| 6,541,988 B2 | 4/2003 | Dangelmayer et al. | | |
| 6,607,993 B1 * | 8/2003 | Dickinson et al. | ........... | 438/795 |
| 6,635,577 B1 * | 10/2003 | Yamartino et al. | ........... | 438/706 |
| 2002/0045328 A1 | 4/2002 | Kobayashi | | |

* cited by examiner

*Primary Examiner*—Caridad M. Everhart
(74) *Attorney, Agent, or Firm*—Townsend and Townsend and Crew LLP

(57) ABSTRACT

Method and apparatus for removing and neutralizing charges. The method includes loading a structure into a chamber. The structure includes a first surface and a plurality of charges away from the first surface. Additionally, the method includes supplying a first ionized gas to the first surface of the structure, and radiating the structure with a first ultraviolate light. The supplying a first ionized gas and the radiating the structure with a first ultraviolate light are performed simultaneously for a first period of time.

27 Claims, 7 Drawing Sheets

(A)

(B)

SYSTEM AND METHOD FOR REMOVING CHARGES WITH ENHANCED EFFICIENCY

CROSS-REFERENCES TO RELATED APPLICATIONS

This application claims priority to U.S. Provisional No. 60/538,446, filed Jan. 21, 2004, which is incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to electric discharge and neutralization. More particularly, the invention provides a system and method for removing charges with improved efficiency. Merely by way of example, the invention has been applied to a semiconductor substrate and its associated structure. But it would be recognized that the invention has a much broader range of applicability.

A semiconductor substrate is often used for making an integrated circuit. The fabrication process uses various types of techniques, such as etching, deposition, and photolithography. During the fabrication, the semiconductor substrate and its associated structure are often transported from one location to another location. The transportation and fabrication processes may result in static charges located inside the semiconductor substrate and its associated structure.

These static charges can adversely affect subsequent fabrication or inspection processes. To reduce the adverse effect, a conventional pre-charging technique has been developed for SEM inspection. The pre-charging technique uses a flood gun to create strong and equalized charging on a semiconductor substrate and its associated structure. The charging can reduce or eliminate the non-uniform distribution of electrostatic charges generated prior to or and/or during the SEM inspection. But the pre-charging technique may result in image distortions in gray scale, reduced image sensitivity and resolution, and time-dependent location-related differences due to non-uniform charge leakage.

Additionally, to reduce the adverse effect on fabrication or inspection processes, some conventional techniques have been developed to remove electric charges. These conventional techniques include ionizer radiation and ultraviolet (UV) illumination. The ionizer radiation generates and transports the ionized air to neutralize electrostatic charges on the surface of a semiconductor substrate and its associated structure. This technique has been applied to wafer lithography, wafer transport, scanning electron microscopy (SEM) inspection, and atomic force microscopy (AFM) inspection. But the ionizer radiation technique often cannot effectively neutralize electric charges located inside an insulation film away from the film surface. Another conventional technique uses UV illumination. The radiated semiconductor substrate often includes grounded conductive traces. But the UV illumination technique usually cannot effectively neutralize electric charges far away from conductive traces.

Hence it is highly desirable to improve techniques for removing and neutralizing electric charges.

BRIEF SUMMARY OF THE INVENTION

The present invention is directed to electric discharge and neutralization. More particularly, the invention provides a system and method for removing charges with improved efficiency. Merely by way of example, the invention has been applied to a semiconductor substrate and its associated structure. But it would be recognized that the invention has a much broader range of applicability.

According to one embodiment of the present invention, a method for removing and neutralizing charges is provided. The method includes loading a structure into a chamber. The structure includes a first surface and a plurality of charges away from the first surface. Additionally, the method includes supplying a first ionized gas to the first surface of the structure, and radiating the structure with a first ultraviolate light. The supplying a first ionized gas and the radiating the structure with a first ultraviolate light are performed simultaneously for a first period of time.

According to another embodiment, a method for removing and neutralizing charges includes loading a structure into a chamber. The structure includes a surface and a plurality of charges away from the surface. Additionally, the method includes supplying a first ionized gas to the surface of the structure, and radiating the structure with a first ultraviolate light. Moreover, the method includes measuring a charge amount associated with the structure, processing information associated with the charge amount and a predetermined threshold, and determining whether additional charge removal and neutralization is needed based on at least information associated with the charge amount and the predetermined threshold.

According to yet another embodiment, an apparatus for removing and neutralizing charges includes a chamber, an ionizer in the chamber, and an ultraviolate source in the chamber. The ionizer and the ultraviolate source are capable of operating at the same time.

According to yet another embodiment, an apparatus for removing and neutralizing charges includes a chamber, a plurality of ionizers in the chamber, and a plurality of ultraviolate sources in the chamber. At least one of the plurality of ionizers is located between two of the plurality of ultraviolate sources, and at least one of the plurality of ultraviolate sources is located between two of the plurality of ionizers.

Many benefits are achieved by way of the present invention over conventional techniques. For example, certain embodiments of the present invention can provide ultraviolate radiation and ionized gas simultaneously and effectively remove charges in a charged structure. For example, the ultraviolate radiation provides energy within a wavelength range capable of generating a significant photoconduction effect in insulating materials of the charged structure. Additionally, the ionized gas can provide a significant number of electrons and/or ions on the surfaces of the charged structure. Some embodiments of the present invention reduce or remove oxygen gas before ultraviolate sources are turned on. The removal of oxygen gas can prevent or reduce generation of ozone, which can oxidize an charged structure and thus reduce yield of semiconductor manufacturing.

Certain embodiments of the present invention can remove charges in various regions of an insulating layer of a charged structure. These regions may reside close or far away from the surfaces of the insulating layer. For example, the charges can be neutralized by the electrons and/or ions on the surfaces of the charged structure and through the conductive connections of the charged structure linked to a constant voltage source. Some embodiments of the present invention improve efficiency for removing and neutralizing charges in various regions of a charged structure. These regions may be far away from the conductive connections biased to a constant voltage. Certain embodiments of the present invention reduce dependency of the charge removal efficiency on the number of conductive connections and/or distribution of conductive connections biased to a constant voltage. Some embodiments of the present invention can eliminate or reduce electrostatic charges at superficial, shallow and deep locations in an insulation film of a patterned wafer.

Certain embodiments of the present invention are suitable for low, moderate, and high landing energies for SEM applications. Additionally, some embodiments of the present invention are substantially free from the weaknesses of the conventional pre-charging technique. These embodiments usually would not result in image distortions in gray scale, reduced image sensitivity and resolution, and/or time-dependent location-related differences due to non-uniform charge leakage.

Various additional objects, features and advantages of the present invention can be more fully appreciated with reference to the detailed description and the accompanying drawings that follow.

DETAILED DESCRIPTION OF THE INVENTION

The present invention is directed to electric discharge and neutralization. More particularly, the invention provides a system and method for removing charges with improved efficiency. Merely by way of example, the invention has been applied to a semiconductor substrate and its associated structure. But it would be recognized that the invention has a much broader range of applicability.

Figure 1:
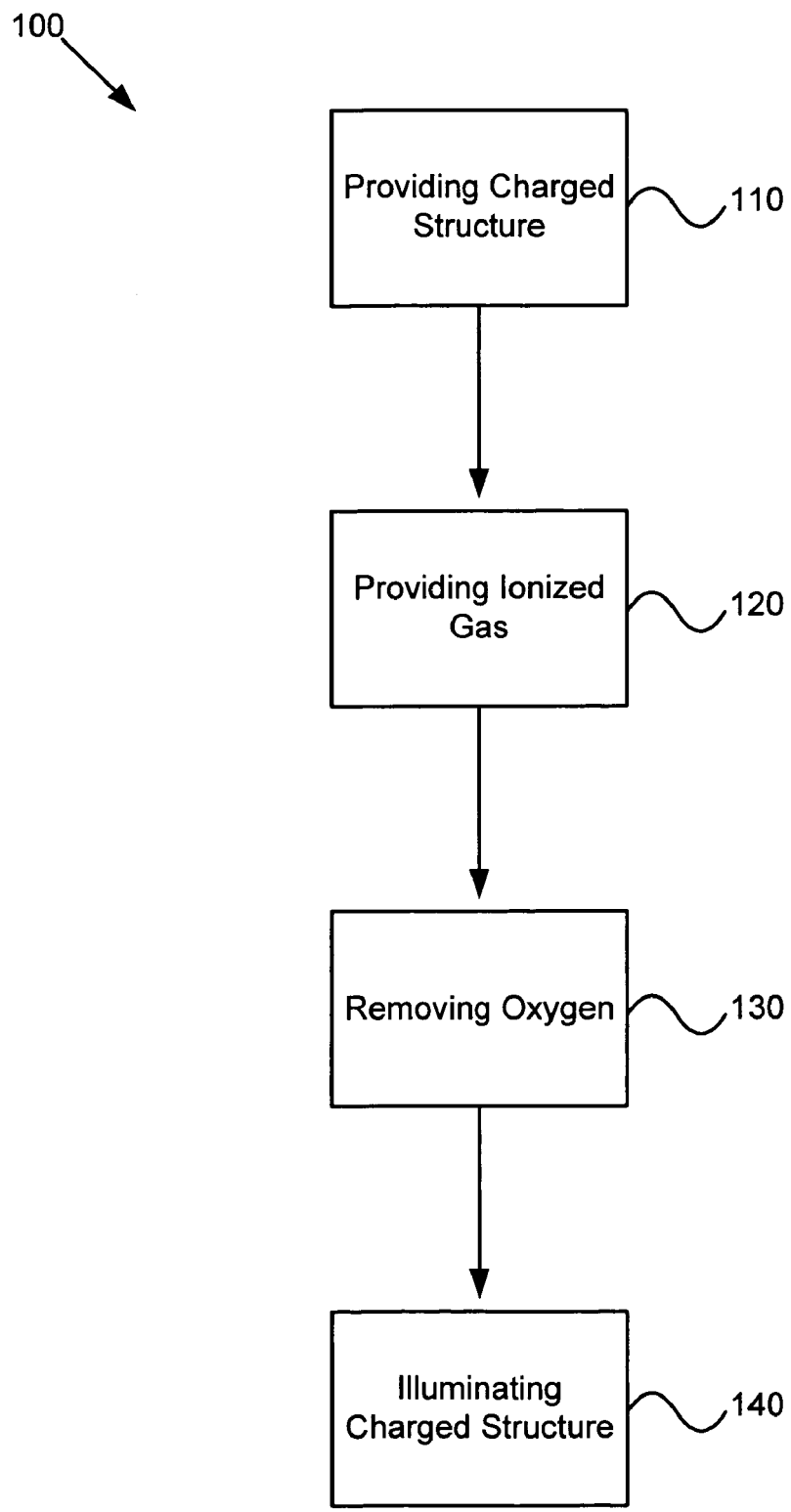
FIG. 1 is a simplified method for charge removal and neutralization according to an embodiment of the present invention.

FIG. 1 is a simplified method for charge removal and neutralization according to an embodiment of the present invention. This diagram is merely an example, which should not unduly limit the scope of the claims. One of ordinary skill in the art would recognize many variations, alternatives, and modifications. A method 100 includes a process 110 for providing charged structure, a process 120 for providing ionized gas, a process 130 for removing oxygen, and a process 140 for illuminating charged structure. Although the above has been shown using a selected group of processes for the method 100, there can be many alternatives, modifications, and variations. For example, some of the processes may be expanded and/or combined. Other processes may be inserted to those noted above. Depending upon the embodiment, the sequence of processes may be interchanged with others replaced. For example, the process 130 is skipped. As another example, the process 120 is preformed before, after, and/or at the same time as the process 140. In yet another example, the process 120 is performed before, during, and/or after the processes 110, 130, and 140 are performed. Further details of these processes are found throughout the present specification and more particularly below.

At the process 110, a charged structure is provided. In one embodiment, the charged structure includes one or more charged regions. The charged regions are either positively charged or negatively charged. For example, some charged regions are located in an insulating layer. In another example, certain charged regions are located in a conductive or semi-conductive layer. The conductive or semi-conductive layer does not have any conductive connection with any constant voltage source. In yet another example, the net charge of the charged structure is either zero or non-zero.

In another embodiment, the charged structure also includes one or more conductive connections to an external voltage source. The external voltage source can provide a constant voltage level such as the ground level. For example, certain charged regions are located in a conductive or semi-conductive layer, which is insulated from the conductive connections. In yet another embodiment, the charged structure covers an entire semiconductor wafer, one or more dies, or one or more sample areas. For example, the semiconductor wafer is a silicon wafer. In yet another embodiment, the charged structure is loaded into a chamber.

Figure 2:
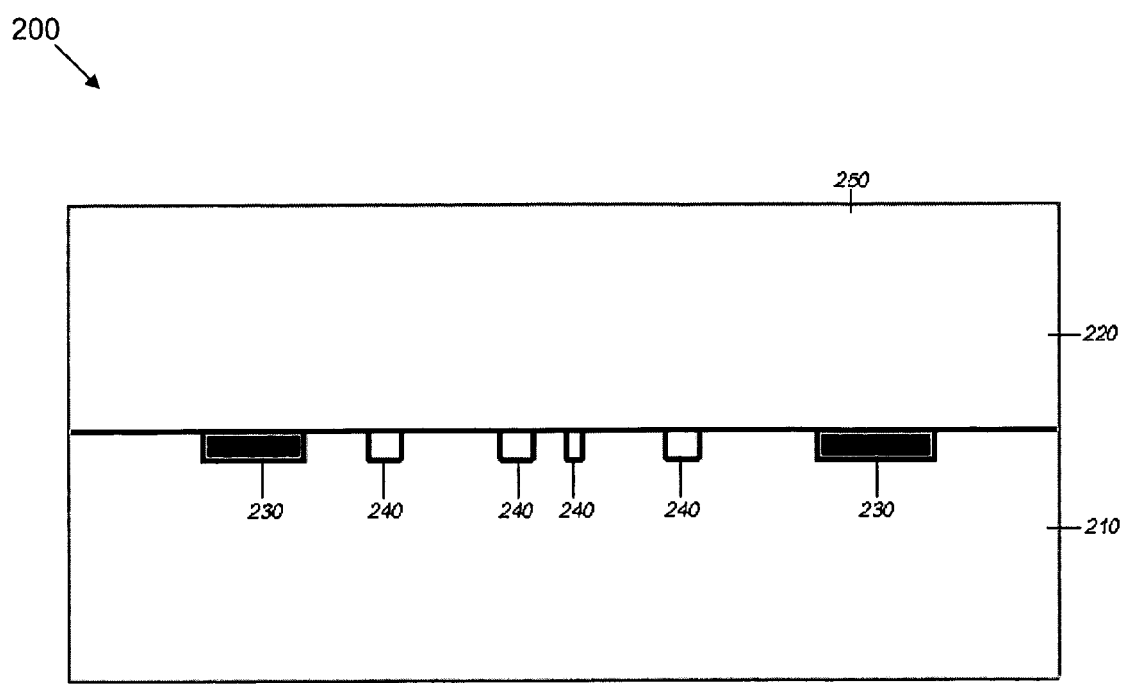
FIG. 2 is a simplified charged structure provided by the process 110 according to an embodiment of the present invention.

FIG. 2 is a simplified charged structure provided by the process 110 according to an embodiment of the present invention. This diagram is merely an example, which should not unduly limit the scope of the claims. One of ordinary skill in the art would recognize many variations, alternatives, and modifications. A charged structure 200 includes a semiconductor substrate 210 and an insulating layer 220. The semiconductor substrate 210 includes conductive connections 230 to a voltage source. For example, the voltage source provides a constant voltage, such as that at the ground level. Additionally, the semiconductor substrate 210 includes conductive connections 240 that are not connected to any voltage source. The insulating layer 220 is located on the semiconductor substrate and in direct contact with the conductive connections 230. The insulating layer 220 has a net positive charge or a net negative charge.

As discussed above and further emphasized here, FIG. 2 is merely an example, which should not unduly limit the scope of the claims. One of ordinary skill in the art would recognize many variations, alternatives, and modifications. For example, the semiconductor substrate 210 does not include the conductive connections 240. In another example, the insulating layer 220 is located indirectly on the semiconductor substrate 210. In yet another example, the insulating layer 220 is either exposed or at least partially covered by another layer.

At the process 120, the ionized gas is provided to the vicinity of the surfaces of the charged structure. In one embodiment, the ionized gas includes electrons and positively charged ions. In another embodiment, the ionized gas is provided by ionizing the air.

According to yet another embodiment, FIG. 2 shows that the surfaces of the charged structure include at least part of a surface 250 of the insulating layer 220. In yet another embodiment, the surfaces of the charged structure do not includes any part of the surface 250 of the insulating layer 220.

At the process 130, the oxygen gas is removed from the ambient of the charged structure. For example, the oxygen gas is blown away by the nitrogen gas. In another example, the oxygen gas is blown away by an inert gas. In one embodiment, the process 120 is performed when and after the process 130 is performed.

In another embodiment, the process 130 is replaced by another process at which the oxygen gas is reduced in the ambient of the charged structure. For example, the oxygen gas is partially blown away by the nitrogen gas. In another example, the oxygen gas is completely blown away by the nitrogen gas. In yet another example, the oxygen gas is partially blown away by an inert gas. In yet another example, the oxygen gas is completely blown away by an inert gas. In yet another example, the oxygen gas is partially removed from the ambient of the charged structure. In yet another example, the oxygen gas is completely removed from the ambient of the charged structure. In yet another example, the process 120 is performed when and after the process for reducing oxygen is performed. In yet another embodiment, the process for reducing oxygen is skipped.

At the process 140, the charged structure is illuminated by ultraviolet light. In one embodiment, the charged structure is located on a wafer. For example, the wafer is rotated around its center during the process 140. The rotation can significantly improve the uniformity of illumination of the ultraviolet light on the wafer including the charged structure. In another example, the wafer is not rotated around its center. According to an embodiment of the present invention, the process 140 is performed when and after the process 130 is performed.

Figure 3:
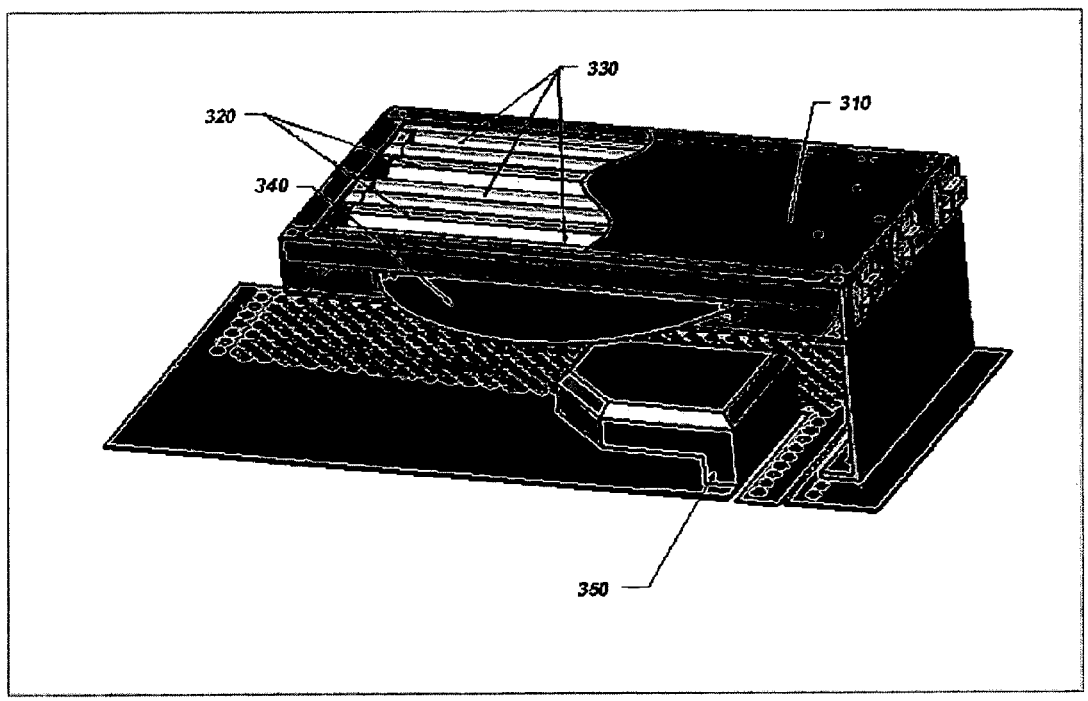
FIG. 3 is a simplified apparatus for charge removal and neutralization according to an embodiment of the present invention.

FIG. 3 is a simplified apparatus for charge removal and neutralization according to an embodiment of the present invention. This diagram is merely an example, which should not unduly limit the scope of the claims. One of ordinary skill in the art would recognize many variations, alternatives, and modifications. A system 300 includes a chamber 310, ionizers 320, and ultraviolate sources 330. Although the above has been shown using a selected group of components for the apparatus 300, there can be many alternatives, modifications, and variations. For example, some of the components may be expanded and/or combined. Other components may be inserted to those noted above. For example, the system 300 also includes a gas outlet. The gas outlet can supply a nitrogen gas or an inert gas to the chamber 310. Depending upon the embodiment, the arrangement of components may be interchanged with others replaced. The apparatus can be used to perform the method 100. Further details of these components are found throughout the present specification and more particularly below.

The ionizers 320 and the ultraviolate sources 330 are located inside the chamber 310. The chamber 310 can accept a charged structure. For example, the chamber is closed. In another example, the chamber is open. In one embodiment, the charged structure is located on a wafer. In another embodiment, the ionizers 320 include ionizer bars, and the ultraviolate sources 330 include ultraviolate lamp tubes. For example, any two ultraviolate lamp tubes are separated by at least one ionizer bar, and any two ionizer bars are separated by at least one ultraviolate lamp tube. The effective length of the tubes and bars cover both edges of the wafer in one direction where the charged structure is located. The width of the tube-bar array covers both edges of the wafer in another direction. For example, the diameter of the wafer is either 12 inches or 8 inches. The relative positions and spatial distances among the tubes, the bars and the wafer are adjustable.

In another embodiment, the ultraviolet sources 330 each emits strong radiation at a wavelength ranging from 100 nm to 300 nm. For example, the ultraviolate sources 330 each emits strong radiation peaked at the wavelength of about 185 nm. According to another embodiment, as shown in FIG. 2, the insulating layer 220 includes $SiO_2$ and/or $Si_3N_4$. $SiO_2$ often exhibits strong absorption at about 155 nm, and $Si_3N_4$ often exhibits strong absorption at about 205 nm. Accordingly, the strong radiation at about 185 nm is suitable for both $SiO_2$ and/or $Si_3N_4$. In yet another embodiment, strong radiation at wavelengths between 100 nm and 300 nm is suitable to produce desirable photoconduction effect in many insulating layers made of $SiO_2$ and/or $Si_3N_4$. In yet another embodiment, the ultraviolet sources 330 are Ster-L-Ray ozone-type Germicidal Lamps of 17¼"/39 W with an active length of 16". In yet another embodiment, the ionizers 320 are 15" NRD Alpha bars with an active ionization length of 13".

The apparatus 300 can be used to perform the method 100. In one embodiment, the ionizers 320 remain active during the processes 110, 120, 130, and 140. At the process 110, a wafer 340 including a charged structure is loaded into the chamber 310 and positioned onto a wafer seat. The wafer seat is located below the ionizers 320 and the ultraviolate sources 330. When the wafer 340 is positioned onto the wafer seat, ground traces of the wafer 340 are connected to the ground voltage level, in one example, by controllable grounding pins. For example, the ground traces of the wafer 340 include the conductive connections 230 as shown in FIG. 2. In another embodiment, the wafer seat is replaced by a holder configured to support the charged structure and provide connections conductively between the charged structure and a constant voltage source.

At the process 120, the gas inside the chamber 310 is ionized by the ionizers 320. In one embodiment, the process 120 is performed during the processes 110, 130, and 140. At the process 130, the oxygen gas is removed from the chamber 310 by supplying the nitrogen gas. The ambient gas around the wafer 340 becomes substantially free from the oxygen gas. Alternatively, the oxygen gas is reduced in the chamber 310 by supplying the nitrogen gas. At the process 140, the ultraviolate sources 330 are turned on, and the charged structure is illuminated by ultraviolate radiation. In one embodiment, the process 140 is performed while the ionized gas is provided to the vicinity of the charged structure. For example, the combined irradiation by ultraviolate light and charged particles lasts for shorter than or equal to about 30 minutes. The desirable time depends on the strength of ultraviolate sources, the strength of ionizers, the distance between the charged structure and the ultraviolate sources and ionizers, the wavelengths of ultraviolate radiation, and types of materials in the charged structure. In another embodiment, after the entire charged structure is processed, the ultraviolate sources 330 are turned off. Afterwards, the nitrogen supply is also turned off.

In another embodiment, the process 130 is skipped. The ultraviolate sources remain on before the charged structure is loaded into the chamber 310 and/or the charged structure is removed from the chamber 310.

As discussed above and further emphasized here, FIG. 3 is merely an example, which should not unduly limit the scope of the claims. One of ordinary skill in the art would recognize many variations, alternatives, and modifications. For example, the chamber 310 is located above a wafer pre-aligner 350 of a wafer handler. At the process 110, the wafer 340 is transferred from the wafer pre-aligner 350 onto the wafer seat inside the chamber 310.

In another embodiment, the ionizers 320 and the ultraviolate sources 330 cover only a portion of the wafer or the charged structure. At the process 140, the wafer or the charged structure is rotated so that the entire wafer or the charged structure is radiated by the ultraviolate sources 330 with ambient gas ionized by the ionizers 320. For example, the rotation is performed outside the chamber 310 by the pre-aligner 350. After a rotation, the wafer is loaded and positioned back onto the wafer seat. In another example, the ionizers 320 and the ultraviolate sources 330 cover only half of the wafer 340. After one half of the wafer 340 is processed, the wafer 340 is transferred to the pre-aligner 350 and is rotated by half a turn. The rotated wafer 340 is then returned to the chamber 310. The other half of the wafer is then also processed. In yet another example, the rotation is performed while a portion of the wafer remains inside the chamber 310.

Figure 4:
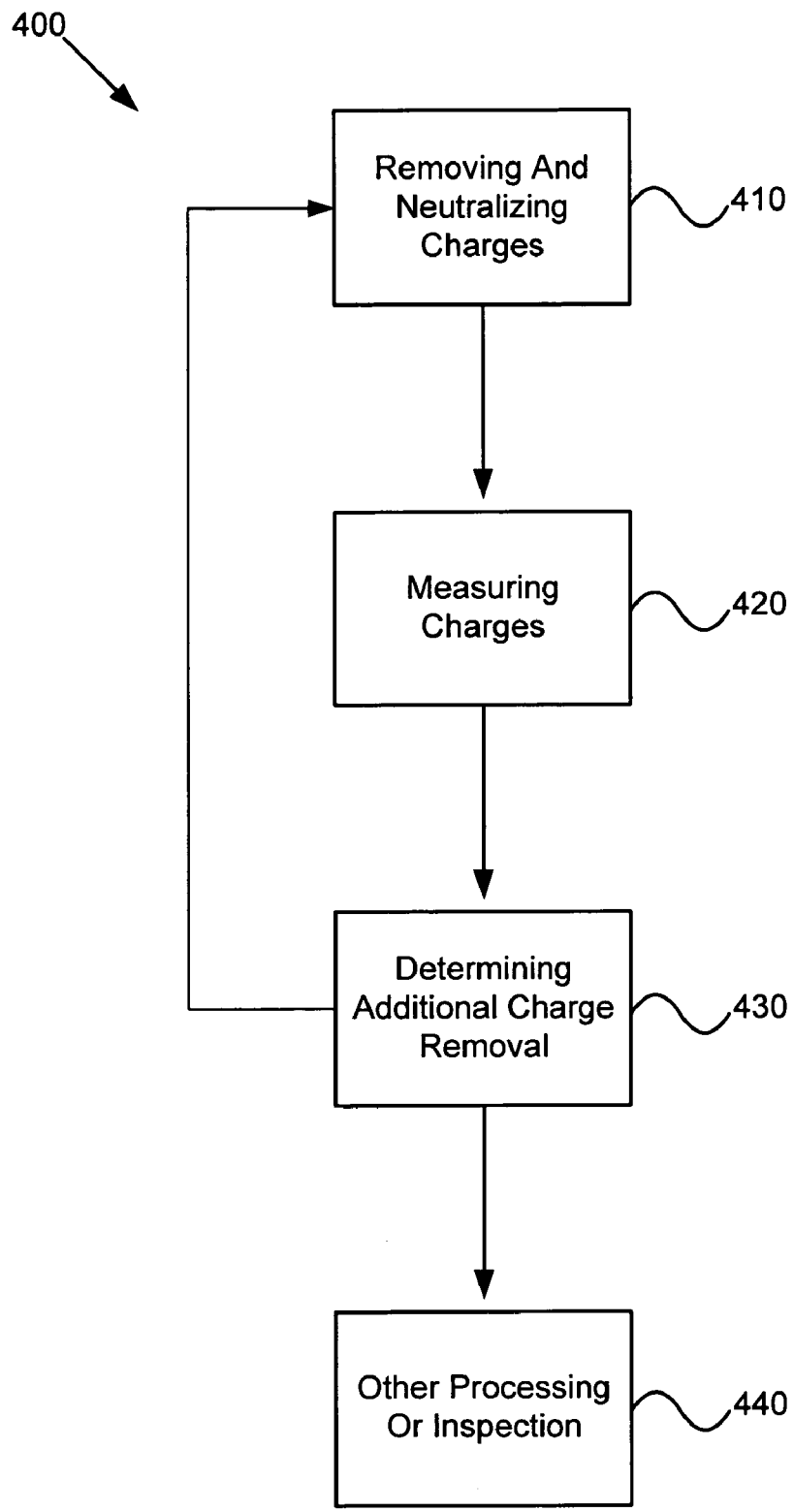
FIG. 4 is a simplified method for charge removal and measurement according to an embodiment of the present invention.

FIG. 4 is a simplified method for charge removal and measurement according to an embodiment of the present invention. This diagram is merely an example, which should not unduly limit the scope of the claims. One of ordinary skill in the art would recognize many variations, alternatives, and modifications. A method 400 includes a process 410 for removing and neutralizing charges, a process 420 for measuring charges, a process 430 for determining additional charge removal, and a process 440 for other processing or inspection. Although the above has been shown using a selected group of processes for the method 400, there can be many alternatives, modifications, and variations. For example, some of the processes may be expanded and/or combined. Other processes may be inserted to those noted above. For example, the processes 410, 420, and/or 430 may be repeated after the process 440 is performed. In another example, the processes 410, 420, and/or 430 may be repeated after part of the process 440 is completed. After the processes 410, 420, and/or 430 are repeated, the process 440 may continue. Depending upon the embodiment, the sequence of processes may be interchanged with others replaced. For example, the process 440 is skipped. Further details of these processes are found throughout the present specification and more particularly below.

At the process 410, some or all of charged particles are removed or neutralized from a charged structure. In one embodiment, the method 100 is used as the process 410. In another embodiment, the process 410 is carried out by a conventional technique. At the process 420, the amount of charge in the charged structure is measured. In one embodiment, as shown in FIG. 3, the ultraviolate sources 330 are turned off, and the processed wafer 340 is then transferred from the chamber 310 onto the pre-aligner 350. A charge distribution is then measured all over the wafer 340. For example, the charge measurement is performed by rotating the wafer 340 and making a Kelvin probe swing along an arc-shaped curve.

At the process 430, the need for additional charge removal is determined. If the measured charge distribution does not satisfy a predetermined threshold, the process 410 is performed. In one embodiment, as shown in FIG. 3, the wafer 340 is transferred from the pre-aligner 350 back to the chamber 310. If the measured charge distribution satisfies the predetermined requirement, the process 440 is performed. In one embodiment, the process 440 includes semiconductor processing, microscopic inspection, and/or wafer transport. For example, the microscopic inspection includes SEM and/or AFM. In another embodiment, as shown in FIG. 4, the wafer 340 is transferred back to a wafer cassette or directly to another procedure, such as SEM inspection.

Figure 5:
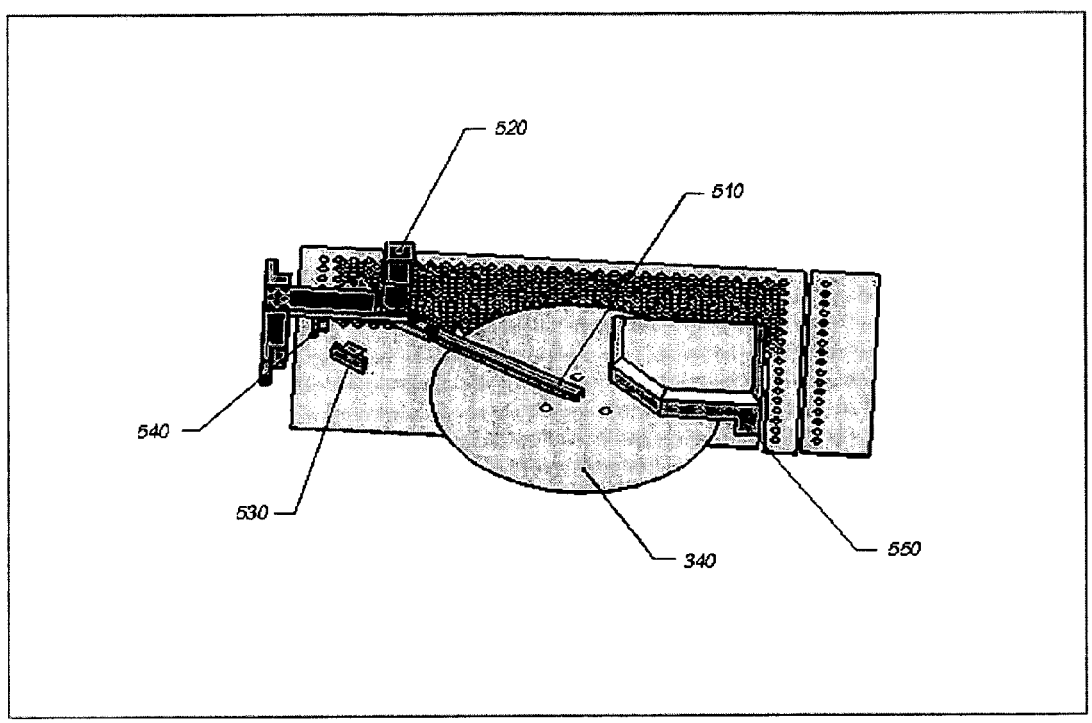
FIG. 5 is a simplified apparatus for charge measurement performed by method for charge removal and measurement according to an embodiment of the present invention.

FIG. 5 is a simplified apparatus for charge measurement performed by the method 400 according to an embodiment of the present invention. This diagram is merely an example, which should not unduly limit the scope of the claims. One of ordinary skill in the art would recognize many variations, alternatives, and modifications. A system 500 includes a probe 510, a motor 520, sensors 540 and 550, and a pre-aligner 560. Although the above has been shown using a selected group of components for the apparatus 500, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

The probe 510 is a part of an electrostatic voltmeter. In one embodiment, the electrostatic voltmeter is TREK Model P1122. In another embodiment, the probe 510 is a Kelvin probe. The Kelvin probe is mounted at the end of an arm that is driven by the motor 520. For example, the arm can swing around the axis of a motor shaft. In another example, the arm is positioned over the pre-aligner 550. In one embodiment, the pre-aligner 550 is the pre-aligner 350 as shown in FIG. 3. In another embodiment, the pre-aligner 550 includes ground pins. For example, the wafer 340 is transferred from the chamber 310 to the pre-aligner 550. On the pre-aligner 550, the grounded traces of the wafer are connected to the ground voltage level through the ground pins in order to provide a good voltage reference for the electrostatic voltmeter. The sensors 530 and 540 include the home sensor 530 and the limit sensor 540. The home sensor 530 provides a position origin of the arm and the probe 510, and the position origin can be used for precise probe motion control and coordinate recording. The limit sensor 540 can prevent the arm and probe from moving out of the predetermined range.

As discussed above, the apparatus 300 and 500 can perform the processes 410 and 420 respectively. Additionally, the apparatus 300 and 500 can be integrated into a system to perform the method 400. According to an embodiment, the system includes the apparatus 300, the apparatus 500, a computer, a wafer transport system, and a charge removal controller. For example, the wafer transport system includes a wafer transport controller and a robot. The computer can send signals to the wafer transport controller and/or the charge removal controller, and receive signals from the wafer transport controller and/or the charge removal controller. For example, the charge removal controller controls the movement of the probe 510. Additionally, the charge removal controller controls the apparatus 300 including turning on and off the ultraviolate sources 330 in response to instructions from the computer. As an example, the ultraviolate sources 330 are turned on once the wafer 340 is loaded onto the wafer seat inside the chamber 310.

In one embodiment, the probe 510 moves along an arc-shaped curve mainly along the radius of the wafer 340 while the wafer 340 rotates with the pre-aligner 550 in response to a command from the computer. Such a record-player-like mechanical structure enables the probe to scan every desirable position on the wafer 340. In another example, coordinates of the probe trajectory are recorded into the computer during the scan of the wafer 340 by the probe 510. Additionally, the output data for the charge measurement are received from the electrostatic voltmeter by the charge removal controller. The output data are then digitized and transferred to the computer. The computer uses the output charge data and the recorded coordinates to generate a charge distribution of the wafer 340. In another example, the computer determines the need for additional charge removal. If additional charge removal is needed, the computer instructs the wafer transport controller and/or the charge removal controller to perform the process 410. If additional charge removal is not needed, the computer instructs other system components for other processing or inspection. In another embodiment, the apparatus 300 and 500 are combined. The charged structure can be processed for charge removal and neutralization and for charge measurement in the chamber 310.

The present invention has various advantages. Certain embodiments of the present invention can provide ultraviolate radiation and ionized gas simultaneously and effectively remove charges in a charged structure. For example, the ultraviolate radiation provides energy within a wavelength range capable of generating a significant photoconduction effect in insulating materials of the charged structure. Additionally, the ionized gas can provide a significant number of electrons and/or ions on the surfaces of the charged structure. Some embodiments of the present invention remove or reduce oxygen gas before ultraviolate sources are turned on. The removal of oxygen gas can prevent or reduce generation of ozone, which can oxidize an charged structure and thus reduce yield of semiconductor manufacturing. For example, the process 130 is used for the method 100 even if the process 120 is skipped.

Certain embodiments of the present invention can remove charges in various regions of an insulating layer of a charged structure. These regions may reside close or far away from the surfaces of the insulating layer. For example, the charges can be neutralized by the electrons and/or ions on the surfaces of the charged structure and through the conductive connections of the charged structure linked to a constant voltage source. Some embodiments of the present invention improve efficiency for removing and neutralizing charges in various regions of a charged structure. These regions may be far away from the conductive connections biased to a constant voltage. Certain embodiments of the present invention reduce dependency of the charge removal efficiency on the number of conductive connections and/or distribution of conductive connections biased to a constant voltage. Some embodiments of the present invention can eliminate or reduce electrostatic charges at superficial, shallow and deep locations in an insulation film of a patterned wafer.

Figure 6:
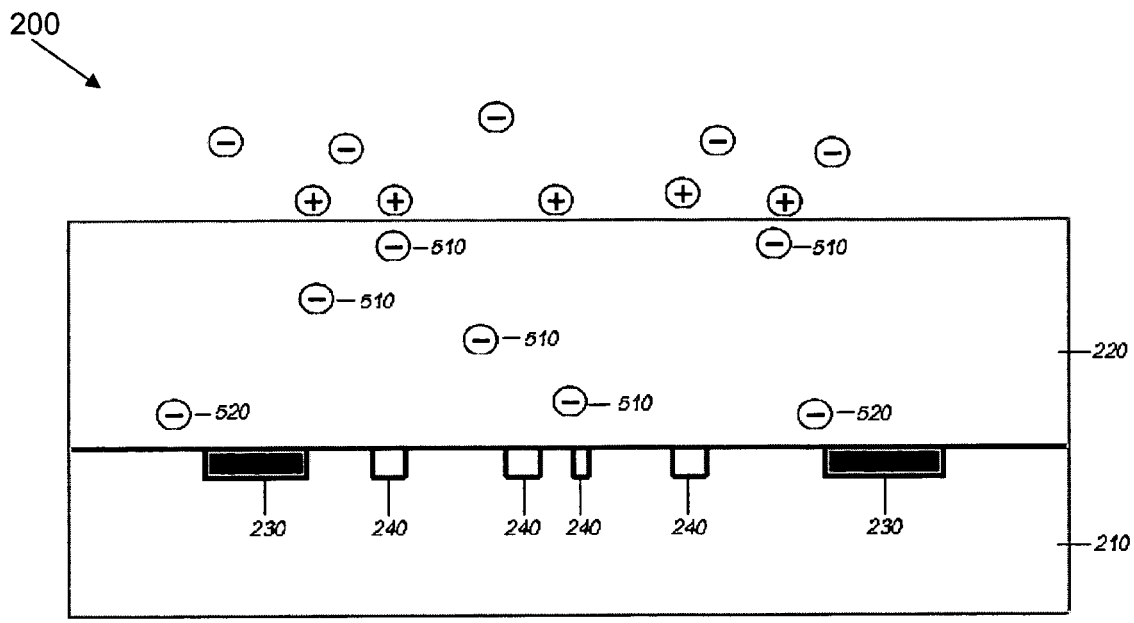
FIGS. 6(A) and (B) are simplified diagrams for charge removal and neutralization according to an embodiment of the present invention.
Figure 6:
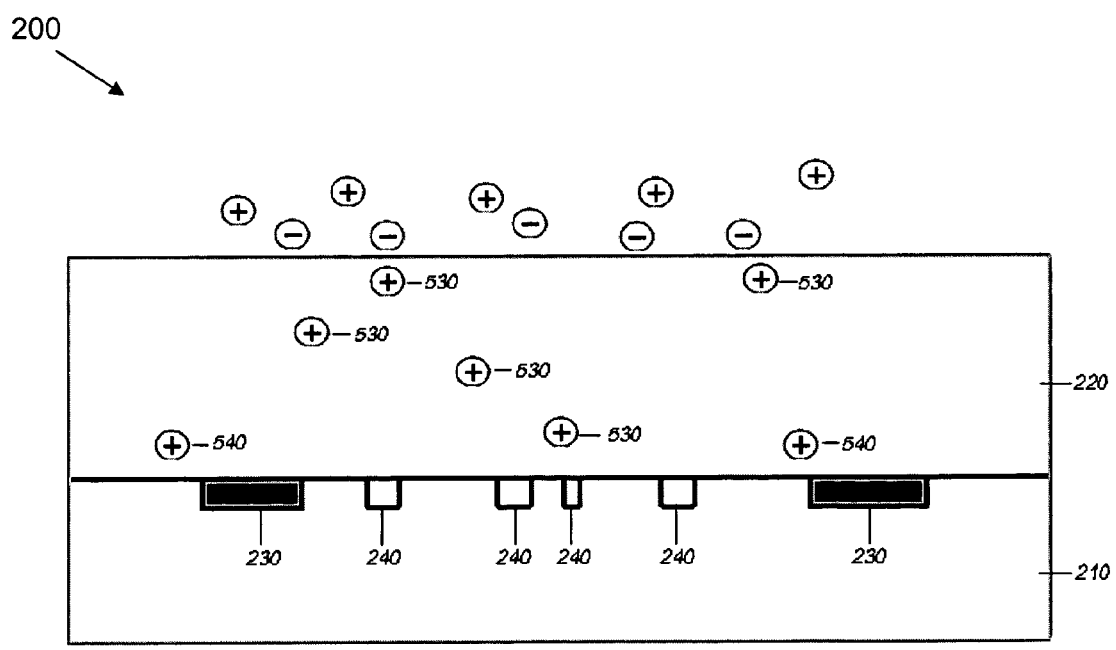

FIGS. 6(A) and (B) are simplified diagrams for charge removal and neutralization according to an embodiment of the present invention. These diagrams are merely examples, which should not unduly limit the scope of the claims. One of ordinary skill in the art would recognize many variations, alternatives, and modifications. As shown in FIGS. 6(A) and (B), the charged structure 200 is processed by the method 100 or the method 400. At the process 140, the ultraviolate radiation can raises the energy levels of the electrons inside the insulating layer 220, and the conductivity of the insulating layer 220. For example, the insulating layer 220 is made of $SiO_2$ or $Si_3N_4$. The ultraviolate radiation excites the electrons in $SiO_2$ or $Si_3N_4$ atoms and generates a number of free electrons. Meanwhile, the ionizers generate and blow the ionized gas to the surfaces of the charged structure 200. Some positive and negative charged particles are located on and/or above the surface of the insulating layer 220.

As shown in FIG. 6(A), the insulating layer 220 is negatively charged. The electrons 510 are neutralized by the positive ions of the ionized gas in the aid of the increased conductivity of the insulating layer 220. Additionally, the electrons 520 are removed through the conductive connections 230. As shown in FIG. 6(B), the insulating layer 220 is positively charged. The positive ions 530 are neutralized by the electrons of the ionized gas in the aid of the increased conductivity of the insulating layer 220. Additionally, the positive ions 540 are removed through the conductive connections 230.

The present invention has various applications. Certain embodiments of the present invention can remove charges from a charged structure. For example, the removal and neutralization can eliminate or reduce adverse effects of charges on inspection and/or semiconductor processing. For example, the inspection includes AFM and/or SEM. In another example, the semiconductor processing includes lithography and/or wafer transfer. The adverse effects may include reduced yields, slippery robot hands, discharge sparks, and/or adhesion of foreign materials onto wafers.

For SEM inspection, if an inspected structure is charged, the produced secondary electrons are either repulsed or attracted by the charges in the inspected structure. The repulsion or attraction often causes unevenness of gray scale values and distortions of images, which may result in false defect detections or even make imaging unfeasible. The charging of the inspected structure may occur before, during, and/or after the SEM inspection.

Figure 7:
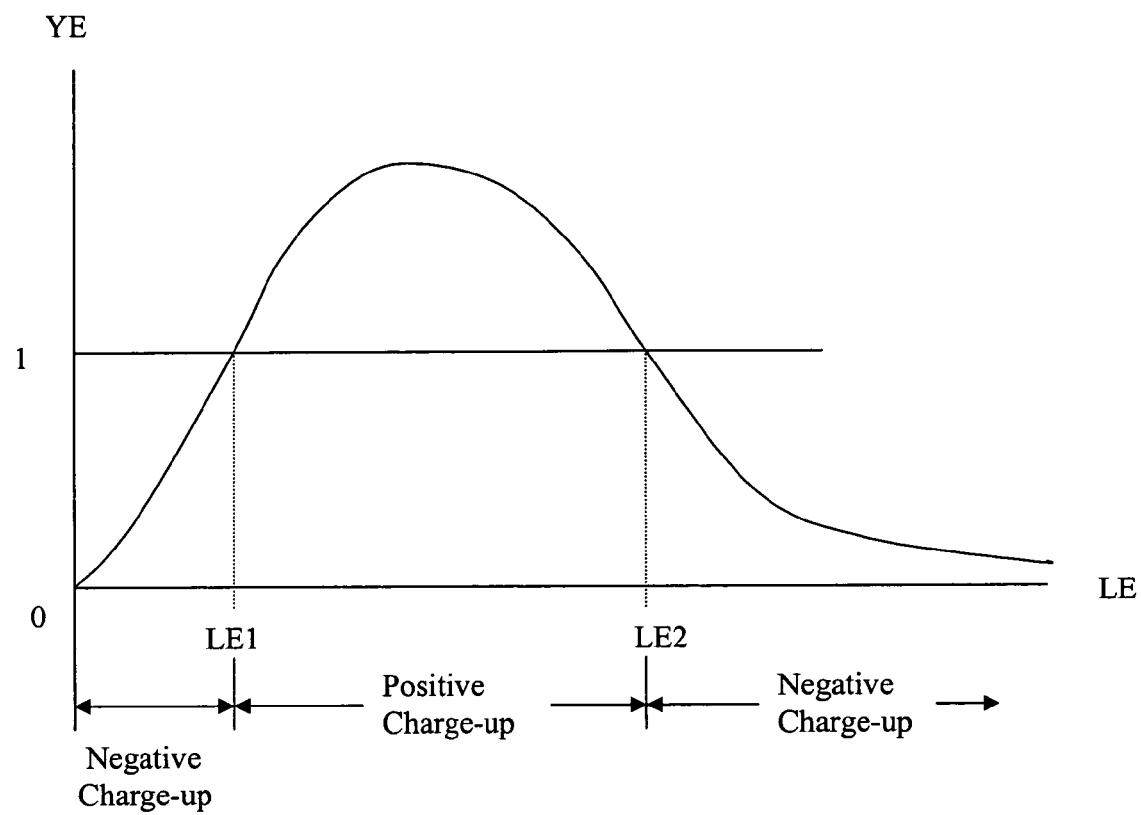
FIG. 7 is a conventional simplified diagram showing yield for secondary electrons as a function of landing energy.

FIG. 7 is a conventional simplified diagram showing yield for secondary electrons as a function of landing energy. The vertical axis represents yield of secondary electrons (YE), and the horizontal axis represents landing energy of electron beam (LE). At two landing energies, LE1 and LE2, the yield of secondary electrons is equal to 1. The number of electrons entering an inspected structure is the same as the number of electrons exiting the inspected structure. No charging of the inspected structure occurs. The values of LE1 and LE2 depend on types of materials in the inspected structure. For example, as shown in FIG. 2, the insulating layer 220 may be made of $SiO_2$ or $Si_3N_4$. For $SiO_2$, LE1 ranges from about 150 eV to 200 eV, and LE2 ranges from about 800 eV to 1000 eV.

For a low landing energy smaller than LE1, the yield of secondary electrons is less than 1. The number of electrons entering the inspected structure is greater than the number of electrons exiting the inspected structure. The inspected structure may be negatively charged. For a moderate landing energy between LE1 and LE2, the yield of secondary electrons is higher than 1. The number of electrons entering the inspected structure is smaller than the number of electrons exiting the inspected structure. The inspected structure may be positively charged. As for a high landing energy higher than LE2, the yield of secondary electrons is lower than 1. The inspected structure may be negatively charged.

A low or moderate landing energy usually offers a good contrast in voltage potential for SEM images, and is often used for enhanced monitoring. As shown in FIG. 2, the charged regions in the insulating layer 220 are often located near the top surface of the insulating layer 220. In contrast, a high landing energy often provide a high resolution and is usually used for detecting miniscule defects. As shown in FIG. 2, the charged regions in the insulating layer 220 are often located far away from the top surface of the insulating layer 220. Hence it is highly desirable to effectively remove charges regardless of locations of these charges.

Conventional techniques usually cannot achieve the desired efficiency for charge removal and neutralization. For example, as shown in FIG. 2, the ionizers alone often cannot scavenge either shallow or deep charges inside the insulating layer 220. Therefore, the use of ionizers alone is usually limited for low and moderate land energies. As another example, the ultraviolate illumination alone often cannot effectively remove shallow charges inside the insulating layer 220. Additionally, the efficiency of removing deep charges depends significantly on the number of the grounded traces 230 and the distribution of the grounded traces 230. For example, the characteristics include wavelength, intensity, and time duration. As discussed above, these two conventional techniques share some common weaknesses with respect to ineffective removal of shallow and deep charges.

In contrast, the inventors of the present invention have discovered that the method 100 and/or the method 400 can effectively remove shallow and deep charges in additional to charges close to the surface according to certain embodiments. The removal of the deep charges does not depend significantly on the number and distribution of conductive connections biased to a constant voltage. The experiment of using certain embodiments of the methods 100 and/or 400 has been performed. A wafer was positively charged to +8V in potential with a medium landing energy that can produce positive charges beyond the shallow layer of an insulate film on the wafer. The charges at such locations are usually difficult to remove with the ionizer radiation method alone, the UV illumination method alone, or separate and sequential usage of both of these methods. In contrast, with the methods 100 and/or 400, all the positive charges were completely removed after one complete irradiation treatment for the wafer.

Some embodiments of the present invention are suitable for low, moderate, and high landing energies for SEM applications. Additionally, certain embodiments of the present invention are substantially free from the weaknesses of the conventional pre-charging technique. These embodiments usually would not result in image distortions in gray scale, reduced image sensitivity and resolution, and/or time-dependent location-related differences due to non-uniform charge leakage.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for removing and neutralizing charges, the method comprising:
   loading a structure into a chamber, the structure including a first surface;
   supplying a first ionized gas to the first surface of the structure;
   radiating the structure with a first ultraviolet light;
   inspecting the structure with a microscope;
   wherein the supplying a first ionized gas and the radiating the structure with a first ultraviolet light are performed simultaneously for a first period of time.

2. The method of claim 1 wherein the supplying a first ionized gas to the first surface of the structure comprises:
   providing an un-ionized gas;
   ionizing the un-ionized gas.

3. The method of claim 1 wherein the supplying a first ionized gas and the radiating the structure with a first ultraviolet light are performed simultaneously for a first period of time shorter than or equal to 30 minutes.

4. The method of claim 1, and further comprising rotating the structure when the radiating the structure with a first ultraviolet light is performed.

5. The method of claim 1, and further comprising:
   rotating the structure after the radiating the structure with a first ultraviolet light;
   supplying a second ionized gas to the first surface of the structure;
   radiating the structure with a second ultraviolet light;
   wherein the supplying a second ionized gas and the radiating the structure with a second ultraviolet light are performed simultaneously for a second period of time.

6. The method of claim 1 wherein the first ultraviolet light is associated with at least one wavelength ranging from 100 nm to 300 nm.

7. The method of claim 1 wherein the structure is located on a silicon wafer.

8. The method of claim 1 wherein the radiating the structure with a first ultraviolet light comprises:
   raising a conductivity of the insulating layer from a first level to a second level;
   neutralizing the plurality of charges with the first ionized gas after the raising a conductivity of the insulating layer.

9. The method of claim 1 wherein the microscope is associated with at least one selected from a group consisting of atomic force microscopy and scanning electron microscopy.

10. The method of claim 1 wherein the chamber is substantially free from any oxygen gas prior to the radiating the structure with a first ultraviolet light.

11. The method of claim 10, and further comprising removing an oxygen gas from the chamber.

12. The method of claim 1 wherein:
    the structure includes an insulating layer; and
    the insulating layer includes a second surface and the plurality of charges away from the second surface.

13. The method of claim 12 wherein the first surface and the second surface are the same.

14. The method of claim 12 wherein the first surface and the second surface are different.

15. The method of claim 12 wherein the insulating layer includes at least one selected from a group consisting of $SiO_2$ and $Si_3N_4$.

16. A method for removing and neutralizing charges, the method comprising:
    loading a structure into a chamber, the structure including a surface and a plurality of charges away from the surface;
    supplying a first ionized gas to the surface of the structure;
    radiating the structure with a first ultraviolet light;
    measuring a charge amount associated with the structure;
    processing information associated with the charge amount and a predetermined threshold;

determining whether additional charge removal and neutralization is needed based on at least information associated with the charge amount and the predetermined threshold;

if the additional charge removal and neutralization is determined to be not needed, inspecting the structure with a microscope.

17. The method of claim 16 wherein the supplying a first ionized gas and the radiating the structure with a first ultraviolet light are performed simultaneously for a period of time.

18. The method of claim 16, and further comprising:

if the additional charge removal and neutralization is determined to be needed, rotating the structure after the radiating the structure;

supplying a second ionized gas to the surface of the structure;

radiating the structure with a second ultraviolet light;

wherein the supplying a second ionized gas and the radiating the structure with a second ultraviolet light are performed simultaneously for a period of time.

19. The method of claim 16 wherein the microscope is associated with at least one selected from a group consisting of atomic force microscopy and scanning electron microscopy.

20. The method of claim 16, and further comprising if the additional charge removal and neutralization is determined to be not needed, performing a process to the structure.

21. The method of claim 20 wherein the process includes at least one selected from a group consisting of transport and lithography.

22. An apparatus for removing and neutralizing charges, the apparatus comprising:

a chamber;
a plurality of ionizers in the chamber;
a plurality of ultraviolet sources in the chamber;
a measurement device configured to measure a charge amount associated with the structure;
a controller configured to send control signals to the measurement device and the plurality of ultraviolet sources;
a transport system configured to transport the structure between at least the chamber and the measurement device;
wherein:
at least one of the plurality of ionizers is located between two of the plurality of ultraviolet sources; and
at least one of the plurality of ultraviolet sources is located between two of the plurality of ionizers.

23. The apparatus of claim 22, and further comprising a gas outlet configured to supply a replacement gas to the chamber and reduce an oxygen gas from the chamber.

24. The apparatus of claim 23 wherein the replacement gas includes a nitrogen gas.

25. The apparatus of claim 22 wherein the ultraviolet sources are configured to emit an ultraviolet light associated with at least one wavelength ranging from 100 nm to 300 nm.

26. The apparatus of claim 22 wherein the chamber comprises a holder configured to support a structure and provide connections between the structure and a constant voltage source.

27. The apparatus of claim 22, and further comprising a computer coupled to the controller and the transport system and configured to determine a need for additional charge removal and neutralization.

* * * * *